United States Patent [19]
Bidnyy et al.

[11] Patent Number: 5,557,109
[45] Date of Patent: Sep. 17, 1996

[54] RADIATION STERILIZATION UNIT

[75] Inventors: Sergei V. Bidnyy, Moscow; Alexander A. Zavadtsev, Reutov; Emmanuel A. Mirochnik, Moscow; Alexander V. Mishchenko, Moscow; Vitaly M. Pirozhenko, Moscow; Igor V. Radchenko, Moscow, all of Russian Federation

[73] Assignee: International Research and Development, Auburn, Ind.

[21] Appl. No.: 327,620

[22] Filed: Oct. 24, 1994

[30] Foreign Application Priority Data

Nov. 1, 1993 [RU] Russian Federation ............. 93049757

[51] Int. Cl.$^6$ ................................................. H01J 37/30
[52] U.S. Cl. ................... 250/455.11; 250/492.3
[58] Field of Search ............................... 250/400, 455.11, 250/492.1, 492.3, 453.11, 454.11, 441.11, 442.11

[56] References Cited

U.S. PATENT DOCUMENTS

| | | | |
|---|---|---|---|
| 3,714,592 | 1/1973 | Jory . | |
| 3,780,308 | 12/1973 | Nablo | 250/492 |
| 4,139,774 | 2/1979 | Katagiri | 250/441 |
| 4,652,763 | 3/1987 | Nablo | 250/492.3 |
| 5,126,571 | 6/1992 | Sakai | 250/443.1 |
| 5,214,290 | 5/1993 | Sakai | 250/400 |
| 5,338,940 | 8/1994 | Takeyama | 250/492.2 |

OTHER PUBLICATIONS

Gerald E. Hare. "Impela Electron Accelerators for Industrial Radiation Processing." *Radiation Physics and Chemistry.* vol. 35, 1990, pp. 619–626.
"Radiation Physics and Chemistry", vol. 35, Nos. 1–3, pp. 357–360, 1990.
"Accelerator Requirements for Electron Beam Processing", R. C. Becker et al., pp. 353–375, 1979.
"Radiation Physics and Chemistry", vol. 15, pp. 99–106, 1980.
"Guideline for Electron Beam Radiation Sterilization of Medical Devices", American National Standard, 1990.
Iotron Industries Canada, Inc., marketing information brochure.

*Primary Examiner*—Bruce C. Anderson
*Attorney, Agent, or Firm*—George Pappas

[57] ABSTRACT

A radiation sterilization unit for sterilizing biological products, prolonging shelf-life of foodstuff, decontamination of clinical waste, and decontamination of microbiological products. A power unit, modulator, and an ultra-high frequency generator are connected via microwave waveguide elements to an electron injector, accelerator and beam deflecting system. The injector, accelerator and beam deflecting system are located in shielding made of cast iron or lead. A manipulator is provided and is selectively received in a cavity in the shielding. Products to be irradiated are placed on the manipulator and the manipulator is linearly received in the cavity placing the products in the field of accelerated electrons. The shielding and the manipulator block dangerous levels of ionizing radiation.

11 Claims, 1 Drawing Sheet

RADIATION STERILIZATION UNIT

TECHNICAL FIELD

The invention concerns the field of accelerator technology, specifically the technology of high frequency charged particle accelerators. The invention can be used for sterilization of medical instruments in clinics, for sterilization of products manufactured in medical industry plants, for prolonging the shelf life of foodstuffs, for decontamination of clinical waste, for microbiological production, and so forth.

BACKGROUND OF THE INVENTION

Various designs of electron accelerators with shielding from braking radiation are used for the purpose of radiation sterilization. All the well-known sterilization units are designed for commercial batch sterilization production and are located in special rooms where concrete walls up to 2.8 m thick serve as shielding. Such sterilization installations are large, heavy, and costly. They are unsuitable for use in clinical conditions, in small-scale production, and in laboratories. Some known sterilization units are described in the following references:

1. "Accelerator Requirements for Electron Beam Processing." R. C. Becker et al. *Radiation Physics and Chemistry*. Vol. 14, 1979, pp. 353–375.
2. William J. Maher. "The Application of Electron Beam Equipment for Sterilization of Medical Devices." *Radiation Physics and Chemistry*. Vol. 15, 1980, pp. 99–106.
3. Gerald E. Hare. "IMPELA Electron Accelerators for Industrial Radiation Processing." *Radiation Physics and Chemistry*. Vol. 35, 1990, pp. 619–626.

Of the well-known sterilization units, the closest with respect to technical characteristics is the IMPELA unit based on the standing wave linear accelerator, which is selected as the prototype. The accelerating system, injector, micro-wave waveguide system, vacuum system, and beam scanning system are mounted on a special platform in this unit and located in a separate room with concrete walls. This installation possesses all of the above enumerated deficiencies.

SUMMARY OF THE INVENTION

The objective of the invention is to reduce the overall dimensions, the weight, and the cost of the unit.

The objective is achieved because the unit for radiation sterilization of medical and food products contains a transporter, a unit for biological shielding from ionizing radiation, and a linear electron accelerator which includes an accelerating section, an injector, a beam deflecting or scanning system, elements of micro-wave waveguide system, an ultra-high frequency generator, a modulator, a power supply unit, and a control unit. In addition, the unit contains a manipulator for conveying the article or products being sterilized from the transporter to the irradiation zone. The biological shield is formed from the units embracing the accelerating section, the injector, and the beam scanning system. The beam deflecting system is equipped with devices which deflect the beam into two perpendicular directions.

The unit for radiation sterilization of medical and food products is comprised of the transporter, the biological shielding unit from ionizing radiation, and the linear electron accelerator which includes the accelerating section, injector, beam deflecting system, micro-wave waveguide elements, ultra-high frequency generator, modulator, power supply unit, and control unit. It is different because the unit incorporates a manipulator for conveying the article being sterilized from the transporter to the irradiation zone. The biological shield is made up of units embracing the accelerating section, the injector, and the beam deflecting system. The beam deflecting system is equipped with devices deflecting the beam into two perpendicular direction.

DESCRIPTION OF SPECIFIC EMBODIMENT

Figure 1:
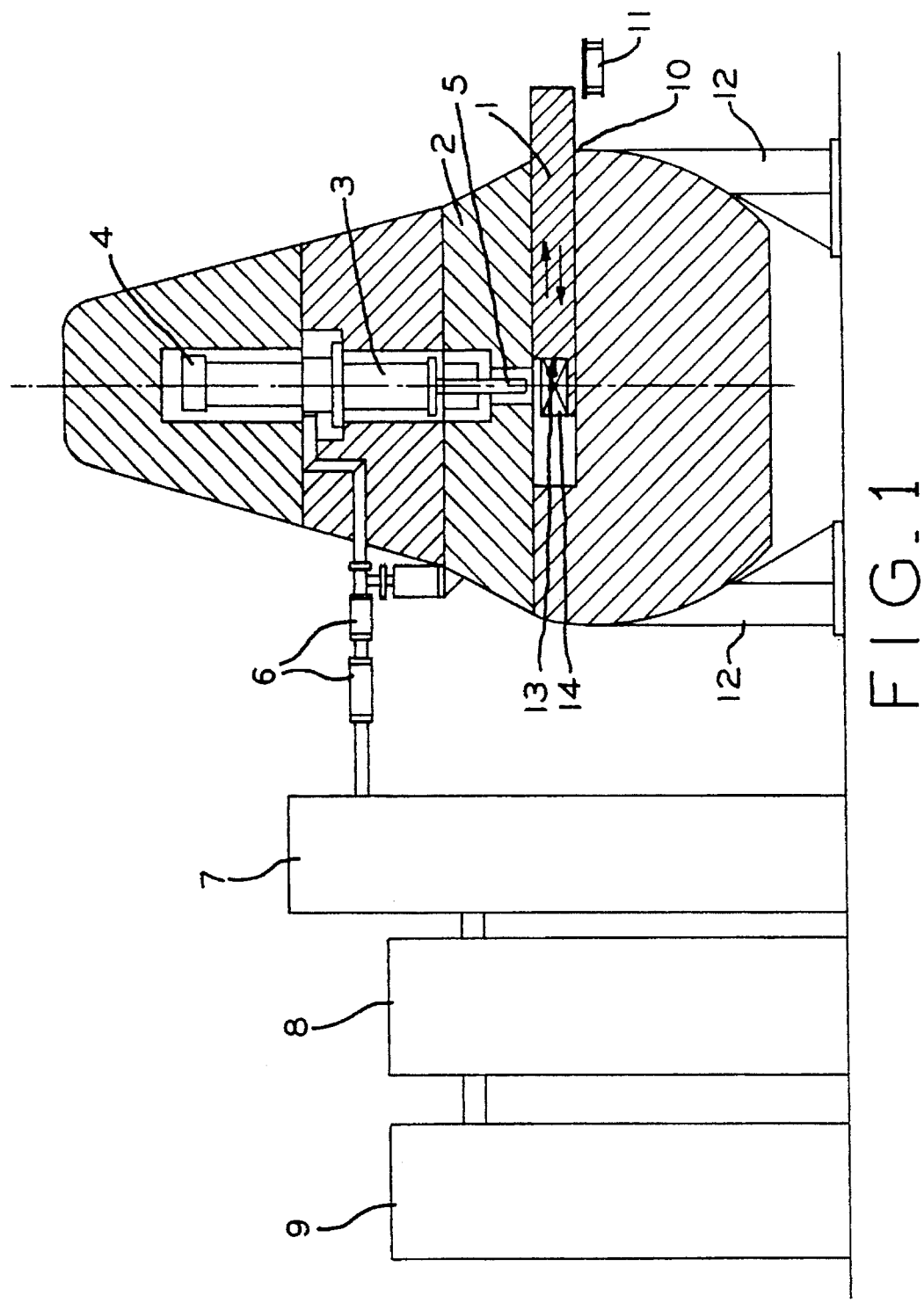
FIG. 1 is a diagrammatic cross-sectional view showing a radiation sterilization unit incorporating a linear transporter according to the present invention.

The proposed unit is depicted in FIG. 1. The unit contains the manipulator 1, the unit for biological shielding from ionizing radiation 2, the accelerating section 3, the injector 4, the beam deflecting or scanning system 5, the micro-wave waveguide elements 6, the ultra-high frequency generator 7, the modulator 8, the power supply unit 9, the hatch 10, and the conveyer-type transporter 11. As shown in FIG. 1, the biological shielding is made up of separate units or sections which embrace or surround the injector 4, the accelerating section 3, the beam deflecting-system 5, and the manipulator 1. As shown, legs 12 are provided for supporting shielding 2 along with manipulator 1, injector 4, accelerating section 3, and beam scanning system 5.

As also shown in FIG. 1, the manipulator 1 is received within a tightly fitting hatch or cavity 10 and as indicated by the arrows, manipulator 1 is adapted for linear movement into and out of hatch 10. Manipulator 1 is further provided with a recess or pocket 13 whereat products 14 to be irradiated are loaded. As shown, the length of manipulator 1, when recess 13 and products 14 are located in the working area under the deflecting system 5, is of sufficient length to fill the hatch or cavity 10. In other words, the length or thickness of manipulator 1 which is received in hatch 10 during sterilization and which serves as shielding from ionizing radiation is approximately as thick as, for example, the shielding surrounding the scanning system 5. Accordingly, dangerous levels of ionizing radiation is prevented from exiting through the cavity or hatch 10.

The unit operates in the following manner. When the accelerator is disconnected and the hatch 10 is opened, the products 14 to be irradiated are brought from the transporter 11 to the recess or pocket 13 of manipulator 1. Products 14 are then transported to the working area by the manipulator 1 which is moved into the hatch or cavity 10. After this the hatch 10 is closed by the manipulator 1 and the accelerator is switched on. Then impulse voltage from the modulator 8 is fed to the ultra-high frequency generator 7 and the injector 4. In the accelerating section 3 ultra-high frequency oscillations are generated by the ultra-high frequency generator accelerates electrons, which are injected by the injector 4. The beam of accelerated electrons is deflected by the deflecting system 5 into two perpendicular directions throughout the entire working area in which the products 14 being irradiated are arranged. The products are sterilized in the field of the beam of accelerated electrons as manipulator 1 is moved linearly placing products 14 in the beam of deflected accelerated electrons. During this sterilization, dangerous levels of ionizing radiation are prevented from exiting the unit by shielding 2 and manipulator 1 which is still located within hatch 10. Finally, after sterilization has been completed, the accelerator is switched off and manipulator 1 is retracted from the hatch or cavity 10 for removal of products 14 from pocket or recess 13 and products 14 are transported away therefrom via transporter 11.

In comparison with the prior art, the proposed design solution has the following advantages. The biological shielding system can be made in the form of a lead or cast iron thick wall container in which is installed the accelerating section, the injector, and the deflecting system. Consequently, the proposed unit has considerably smaller overall dimensions and mass of the biological shielding system than the prior art, in which the accelerator is placed in a special room with concrete walls up to 2.8 m thick. This results in lower cost of capital construction of the unit.

An example of the specific realization can be illustrated by a sterilization unit for medical instruments with 4 Mev accelerated electron energy, and an accelerated electron beam power of 2 kw. The productivity of such a unit, with allowance made for time to load and unload, consists of 100 kg/hr. Overall dimensions of the unit are 2.0×2.0×2.5 m and a mass of 14 tons.

What is claimed is:

1. A radiation sterilization apparatus comprising:

an electron injector;

an electron accelerator coupled to said injector;

an electron beam deflecting system coupled to said accelerator for directionally deflecting accelerated electrons;

shielding surrounding said injector, accelerator and deflecting system for blocking radiation;

a cavity in said shielding;

a linearly movable manipulator selectively received and movable in and out of said cavity, whereby products to be irradiated are placed in the field of accelerated electrons; and, wherein said manipulator has a width sufficient to fill said cavity during irradiation of products, whereby said manipulator blocks dangerous levels of radiation from exiting through said cavity.

2. The apparatus of claim 1 wherein said manipulator includes a recess whereat products to be irradiated are located, said manipulator recess and products thereon being selectively placed in the field of accelerated electrons by linear movement of said manipulator.

3. The apparatus of claim 2 further comprising a transporter whereby products to be irradiated are transported to and away from said manipulator.

4. The apparatus of claim 1 further comprising a transporter whereby products to be irradiated are transported to and away from said manipulator.

5. The apparatus of claim 1 wherein said shielding is made up of separate units, a first unit embracing said injector, a second unit embracing said accelerator, a third unit embracing said deflecting system, and a fourth unit selectively embracing said manipulator.

6. The apparatus of claim 5 wherein said manipulator includes a recess whereat products to be irradiated are located, said manipulator recess and products thereon being selectively placed in the field of accelerated electrons by linear movement of said manipulator.

7. The apparatus of claim 5 wherein said shielding is made of materials selected from a group consisting of lead or cast iron.

8. The apparatus of claim 1 wherein said shielding is made of materials selected from a group consisting of lead or cast iron.

9. The apparatus of claim 1 further comprising a power unit, a modulator coupled to said power unit, and an ultra-high frequency generator coupled to said modulator and feeding impulse voltage to said injector, accelerator, and beam deflecting system through said shielding with microwave waveguide elements.

10. The apparatus of claim 9 wherein said shielding is made up of separate units, a first unit embracing said injector, a second unit embracing said accelerator, a third unit embracing said deflecting system, and a fourth unit selectively embracing said manipulator.

11. The apparatus of claim 9 wherein said manipulator includes a recess whereat products to be irradiated are located, said manipulator recess and products thereon being selectively placed in the field of accelerated electrons by linear movement of said manipulator.

* * * * *